US006531411B1

United States Patent
Domenicucci et al.

(10) Patent No.: US 6,531,411 B1
(45) Date of Patent: Mar. 11, 2003

(54) SURFACE ROUGHNESS IMPROVEMENT OF SIMOX SUBSTRATES BY CONTROLLING ORIENTATION OF ANGLE OF STARTING MATERIAL

(75) Inventors: Anthony G. Domenicucci, New Paltz, NY (US); Neena Garg, Fishkill, NY (US); Kenneth J. Giewont, Hopewell Junction, NY (US); Richard J. Murphy, Clinton Corners, NY (US); Gerd Pfeiffer, Poughquag, NY (US); Gregory D. Pomarico, Beacon, NY (US); Frank J. Schmidt, Jr., Highland Falls, NY (US); Terrance M. Tornatore, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/007,845

(22) Filed: Nov. 5, 2001

(51) Int. Cl.[7] ............................................. H01L 21/461
(52) U.S. Cl. ........................ 438/766; 438/765; 438/14; 438/45
(58) Field of Search ................................ 438/474, 707, 438/758, 765, 766, 800, 14, 45

(56) References Cited

U.S. PATENT DOCUMENTS 4,962,051 A * 10/1990 Liaw .......................... 438/474
5,510,277 A * 4/1996 Cunningham et al. ...... 438/707
5,930,643 A    7/1999 Sadana et al.
6,043,166 A    3/2000 Roitman et al.
6,090,689 A    7/2000 Sadana et al.

OTHER PUBLICATIONS

"SOI Technology: IBM's Next Advance in Chip Design" Source: IBM's Website.

* cited by examiner

Primary Examiner—Kamand Cuneo
Assistant Examiner—Lisa Kilday
(74) Attorney, Agent, or Firm—DeLio & Peterson LLC; Peter W. Peterson; H. Daniel Schnurmann

(57) ABSTRACT

A method of improving surface morphology of a semiconductor substrate when using an SOI technique comprises providing a silicon ingot positioned on a support member, orientating the silicon ingot in relation to the support member, and a cutting device, and cutting the silicon ingot along about a (100) crystal plane of the silicon ingot, preferably using a wire saw. This then provides a silicon substrate having an initial surface defining a miscut angle which is less than about 0.15 degrees from the (100) crystal plane. The method then comprises processing the silicon substrate using SIMOX processing, which includes implanting oxygen atoms in the silicon substrate to form a buried oxide layer and annealing the silicon substrate to provide a final substrate surface. Finally, the method includes accepting the final substrate surface for further processing when the final substrate surface measures between 2–20 Å RMS using an atomic force microscopy technique.

19 Claims, 5 Drawing Sheets

SURFACE ROUGHNESS IMPROVEMENT OF SIMOX SUBSTRATES BY CONTROLLING ORIENTATION OF ANGLE OF STARTING MATERIAL

BACKGROUND OF THE INVENTION

1. Field of the Invention

This invention generally relates to separation by implantation of oxygen (SIMOX) substrates for use in fabricating semiconductor wafers, and more particularly, to surface improvements of separation by implantation of oxygen substrates for use in fabricating semiconductor wafers.

2. Description of Related Art

Methods or processes used when fabricating semiconductor substrates or wafers for further use in the manufacture of semiconductor chips include silicon-on-insulator (SOI), and separation by implementation of oxygen (SIMOX). Known implantation techniques are used for forming buried layer devices known as silicon-on-insulator (SOI) devices using ion implanted oxygen. In these devices, a buried insulator layer is formed beneath a thin surface silicon film. Further wafer fabrication typically includes complementary metal oxide semiconductor (CMOS) processing.

The SIMOX method includes implanting oxygen in very heavy doses and annealing the wafer at a high temperature until a thin layer of SOI film is formed. Preferably, once the SOI film is made, putting transistors on the SOI film is done using similar processes as with a bulk CMOS wafer.

Specifically, SIMOX or separation by implementation of oxygen is a method of fabricating a silicon-on-insulator (SOI) material which can be used in the manufacturing of integrated circuits. SIMOX involves using high-energy ions to implant a large dose of oxygen ions beneath the surface of a bulk Si wafer. Upon high-temperature annealing, the implanted oxygen forms a continuous buried oxide layer, or BOX layer, which electrically isolates the Si at the surface, which is, the superficial layer.

Moreover, the annealing phase redistributes the oxygen ions such that the silicon/silicon dioxide boundaries become smoother and more abrupt, thus forming a sharp and well-defined BOX region. In addition to using annealing to clearly define the buried silicon dioxide layer, annealing can be used to repair damage to the top silicon layer. For example, a wafer can be heated to a temperature in the range from about 1300° C. to about 1350° C. for a duration of between about 2–12 hours.

A problem with the processing technique relates to the defect density. The defect density can be defined in terms of departure from perfect crystallinity in the by silicon layer that is separated from the bulk substrate by the buried oxide layer. In general, as the oxygen ions are implanted into the wafer to produce the buried silicon oxide layer, atomic silicon is replaced. Thereby, excess silicon atoms from the growing BOX layer can alter the crystal structure of the top silicon layer resulting in a variety of point and extended defects, such as threading dislocations and stacking faults, during the ion implantation and/or during the annealing process. These defects degrade the quality and reliability of devices, that is, transistors, that are subsequently formed in the upper silicon layer. Silicon wafers not processed by SIMOX processing include a surface morphology typically determined by a final polish, and do not experience the problems resulting from surface reformation when using SIMOX processing.

More specifically, rough silicon surfaces on substrates or wafers are undesirable in CMOS applications primarily due to poor gate oxide integrity. Complementary metal-oxide semiconductor (CMOS) based chips have impurities added to the wafer or silicon substrate in a doping process. This allows the chip to store an electrical charge which can be measured by ascertaining the capacitance. In order to control the electrical currents needed, the capacitance must be discharged and recharged which requires time, and causes the transistors on the chip to heat up. The transistor generates heat when the transistor, which is generally an electronic version of a switch, is on, and allowing current to flow therethrough.

Further, when fabricating a silicon wafer using CMOS processing, a rough silicon surface can adversely effect gate oxide integrity due to the electric field concentration at the sharp steps on the surface. As the gate oxides continue to scale to thinner films, the sharp steps on the surface of the silicon substrate become increasingly undesirable. A thin gate oxide, $SiO_2$, typically in the range of 20 Å–50 Å is used in all CMOS applications. Thus, the electrical integrity of this film is important for product yield and reliability.

Further, the substrate surface resulting from the silicon ingot is a factor in determining the surface morphology of the SIMOX processed silicon wafer. Once the SIMOX process is completed, the substrates surface morphology can vary in degrees of roughness and include surface abnormalities which render the silicon substrate or wafer undesirable for further processing. Further, undesirable SIMOX processed silicon wafers are disadvantageous because they represent a significant yield loss. Therefore, it is a significant problem in the industry when a processed wafer surface reconstructs after high temperature annealing to form a silicon wafer surface having undesirable surface roughness.

Bearing in mind the problems and deficiencies of the prior art, it is therefore an object of the present invention to provide a method for improving surface morphology on a silicon substrate.

It is another object of the present invention to provide a method for repeatably providing high quality final surface morphology on a silicon substrate.

A further object of the invention is to provide a method for minimizing defect density in a silicon layer after SIMOX processing.

It is a further object of the present invention to provide a method for providing an improved surface morphology on a silicon substrate used in CMOS processing.

It is a further object of the present invention to provide a method for improving gate oxide integrity by providing repeatable high quality final surface morphology on a silicon substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of improving surface morphology of a semiconductor substrate when using an SOI technique comprising providing a silicon ingot positioned on a support member, orientating the silicon ingot on the support member, and cutting the silicon ingot along about a (100) crystal plane of the silicon ingot to providing a silicon substrate having an initial surface. The method then further comprises processing the silicon substrate using SIMOX processing which includes implanting oxygen atoms in the silicon substrate to form a buried oxide layer and annealing the silicon substrate providing a final substrate surface. Preferably, cutting the silicon ingot includes a miscut angle between about 0–0.15 degrees from the (100) crystal plane. The silicon ingot is preferably cut using a wire saw.

After processing the silicon substrate, the method may include fabricating the final substrate surface using CMOS fabrication technique. Also, the method may further comprise measuring a surface morphology of the final substrate surface using an atomic force microscopy technique, and accepting the final substrate surface for CMOS processing when the final substrate surface measures between 2–20 angstroms RMS. After processing the silicon substrate, the final substrate surface may be polished using mirror polishing.

Orientating the silicon ingot may include aligning the ingot in relation to the support member and a cutting device to a predetermined position. After orientating the silicon ingot, the method may include verifying the position of the silicon ingot using x-ray diffraction.

In another aspect, the present invention provides a method of improving surface morphology of a semiconductor substrate when using an SOI technique comprising providing a silicon ingot positioned on a support member, orientating the silicon ingot in relation to the support member, and a cutting device, and cutting the silicon ingot along about a (100) crystal plane of the silicon ingot, preferably using a wire saw. This then provides a silicon substrate having an initial surface defining a miscut angle which is less than about 0.15 degrees from the (100) crystal plane. The method then comprises processing the silicon substrate using SIMOX processing, which includes implanting oxygen atoms in the silicon substrate to form a buried oxide layer and annealing the silicon substrate to provide a final substrate surface. Finally, the method includes accepting the final substrate surface for further processing when the final substrate surface measures between 2–20 Å RMS using an atomic force microscopy technique.

Preferably, after orientating the silicon ingot, the position of the silicon ingot is verified using x-ray diffraction. After accepting the final substrate surface, the method may include fabricating the final substrate surface using CMOS fabrication technique, or polishing the final substrate surface using mirror polishing. Orientating the silicon ingot preferably includes aligning the silicon ingot in relation to the support member and a cutting device to a predetermined position, and verifying the position of the silicon ingot using x-ray diffraction.

In a further aspect, the present invention provides a method of improving surface morphology of a semiconductor substrate when using an SOI technique comprising providing a silicon substrate including an initial surface having a miscut angle from a (100) crystal plane of less than about 0.15 degrees, and processing the silicon substrate using SIMOX processing. Such processing includes implanting oxygen atoms in the silicon substrate to form a buried oxide layer, and annealing the silicon substrate to provide a final substrate surface. Preferably, the final substrate surface measures between about 2–20 Å RMS using an atomic force microscopy technique. After processing the silicon substrate, the method may include fabricating the final substrate surface using a CMOS fabrication technique, polishing the final substrate surface using mirror polishing, or measuring a surface morphology of the final substrate surface using an atomic force microscopy technique and accepting the final substrate surface for CMOS processing when the final substrate surface measures between 2–20 angstroms RMS.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
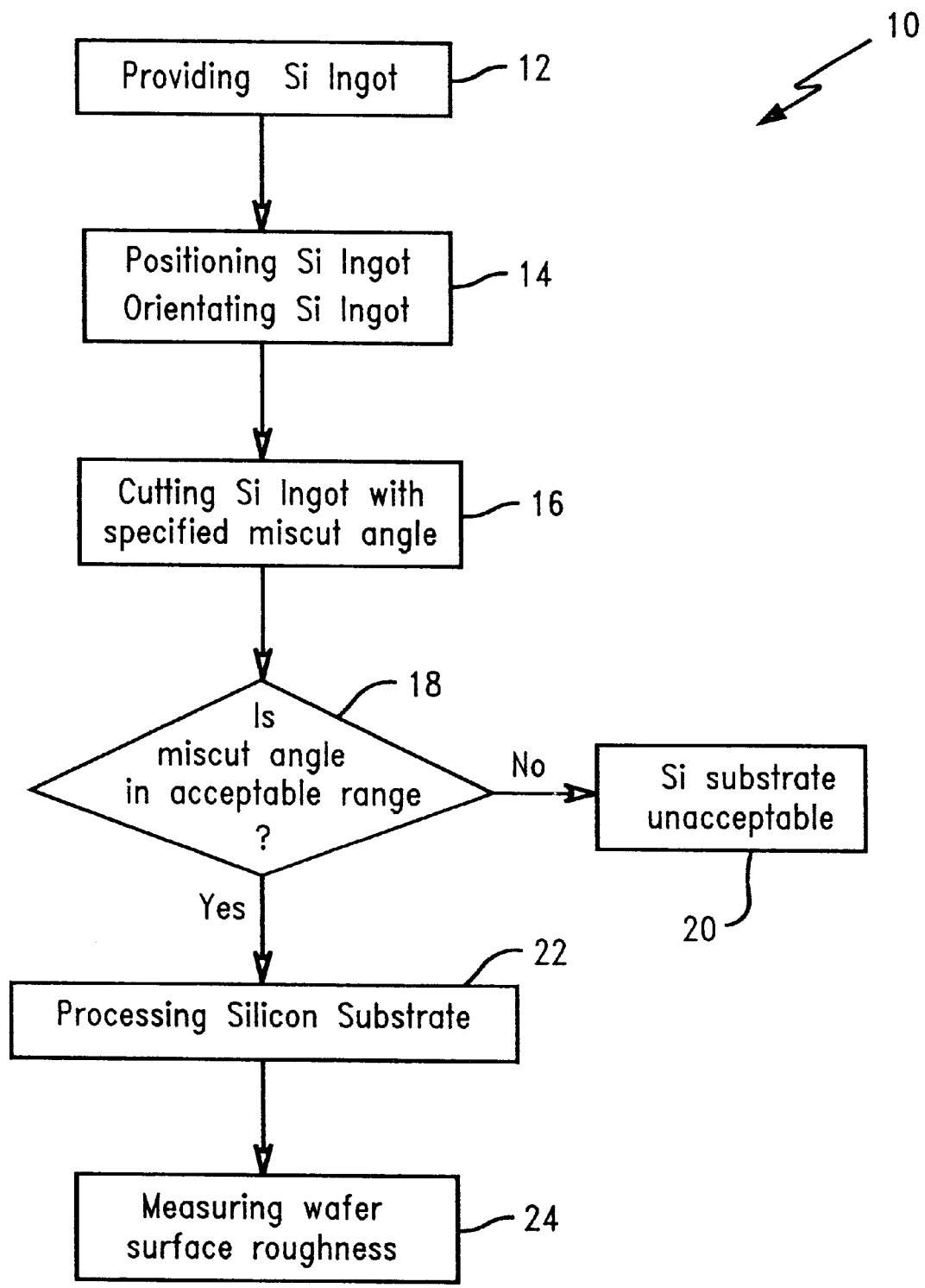
FIG. 1A is a process flow chart showing the steps included in the method of the present invention.

In describing the preferred embodiment of the present invention, reference will be made herein to FIGS. 1–6 of the drawings in which like numerals refer to like features of the invention. Features of the invention are not necessarily shown to scale in the drawings.

Figure 1B:
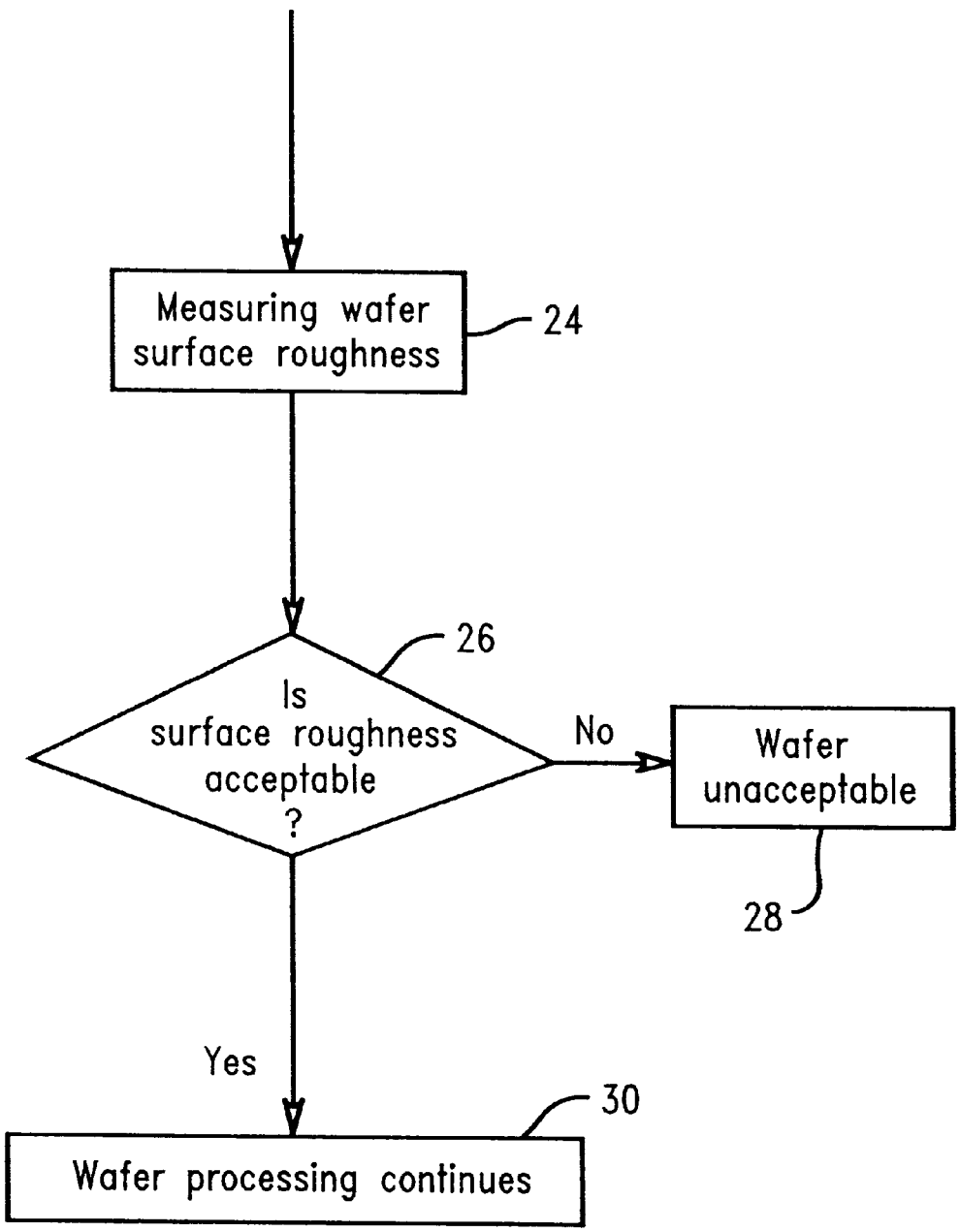
FIG. 1B is a continuation of the process flow chart of FIG. 1A.

Referring to FIGS. 1A and 1B, the preferred method 10 of the present invention provides a first step 12 of supplying a silicon crystal ingot. The silicon ingot has a crystal plane orientation which is established at the beginning of the crystal growth process via the crystal orientation of the seed crystal. The next step 14 is mounting the ingot on a mechanical support, and orientating the silicon ingot in relation to the mechanical support and a cutting device. The orientation is adjusted, and preferably verified using x-ray diffraction.

The next step 16 includes, after the ingot is aligned and held in place by the mechanical support, the ingot being cut using a cutting device along the preferred (100) crystal plane. The desired cut is achieved via the alignment between ingot, mechanical support, and cutting device. The wafer cut angle is preferably targeted at 0° from the (100) crystal plane at the time the wafer is cut. A miscut angle within specified tolerances of preferably about 0–0.15° is provided by cutting the ingot along the targeted cut angle. The preferred tolerance for the miscut angle of between about 0–0.15° can be achieved using current cutting devices, and preferably using a wire saw cutting device. Once the specified angle has been achieved with acceptable tolerances, further fabrication can take place using the SIMOX process. In contrast, typical industry specifications for the miscut allow for tolerances of 1° which is much larger than the required tolerance in the method of the present invention.

As discussed in the background of the invention, numerous disadvantages can occur with current methods of wafer fabrication including SIMOX, including wafer surface abnormalities, roughness and misorientation by the formation of atomic layer steps and terraces. Specifically, after SOI processing using SIMOX, the atomic layer steps and terraces occur because the substrate or wafer surface adjusts to the abnormalities, roughness and misorientations of the substrate surface which are present once the silicon crystal ingot is cut. In particular, the width of the terraces and height of the steps is determined by the miscut angle and the terraced structure can be maintained through epitaxial layers deposited on the surface. Variation in the miscut angle resulting from tolerances in the wafer manufacturing process or, induced deliberately, induce changes in the surface morphology of the substrate wafer which in turn impacts the surface quality of the SOI wafer which may be processed using the SIMOX process.

The next step 18 includes evaluating whether the miscut angle is in the acceptable range. If the miscut angle is not acceptable the next step 20 is to eliminate the wafer for use in SIMOX processing. When the miscut angle is acceptable the next step 22 is to use the substrate in SIMOX processing. After SIMOX processing, the next step 24, is to measure the surface morphology to evaluate if the final wafer surface meets specifications. Then, a determination is made whether the surface roughness is acceptable, step 26. If the surface roughness is acceptable, the wafer processing continues, step 30. If the surface roughness is unacceptable, the wafer is unacceptable for further processing, step 28.

Figure 5:
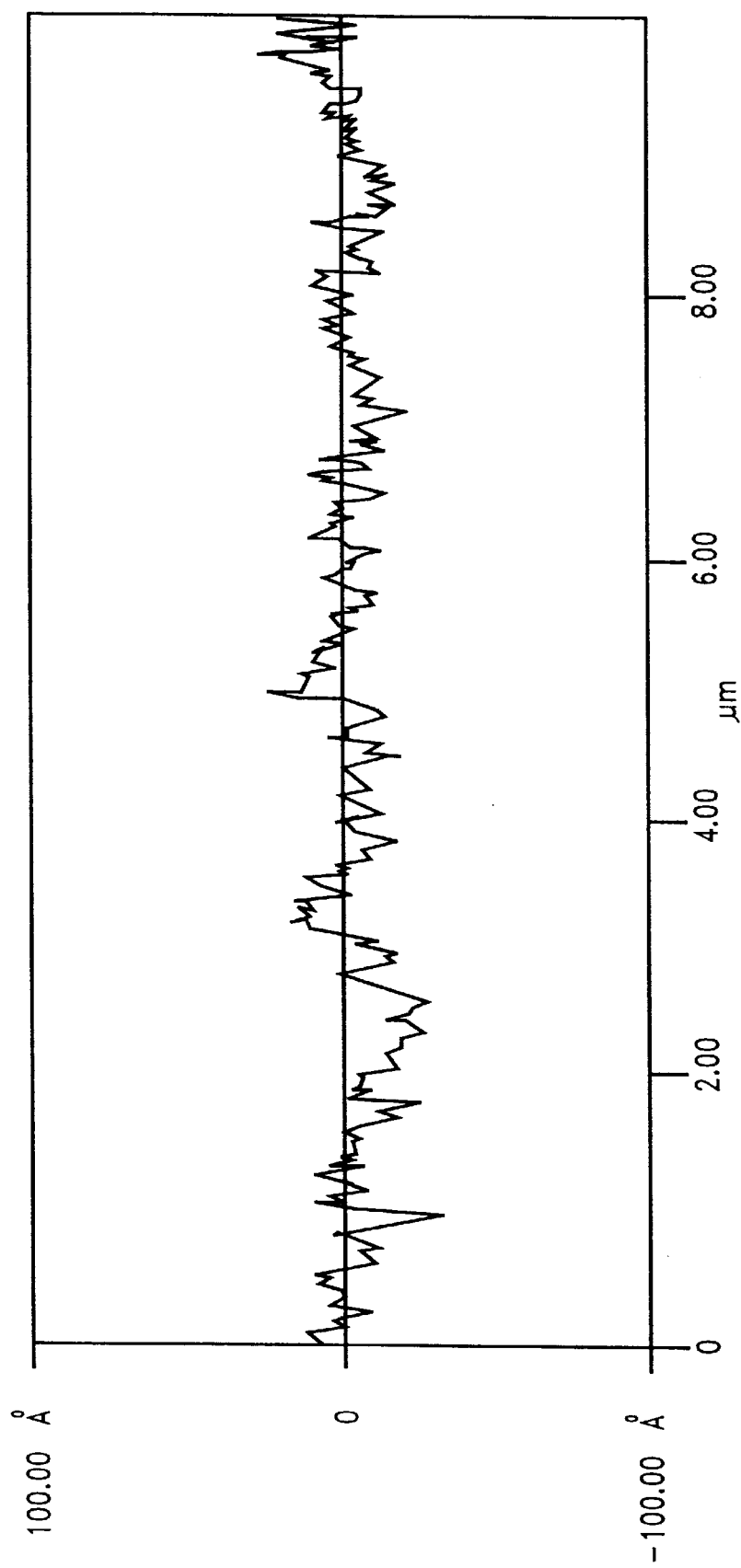
FIG. 5 is a graphical representation of the unacceptable roughness of a mis-cut sample of a silicon wafer cut from a silicon ingot.

The surface morphology can be measured for a determination of acceptable roughness, using the atomic force microscopy (AFM) technique known in the industry. AFM is used for analyzing the surface of a rigid material all the way down to the level of the atom. A mechanical probe is used when applying the AFM technique to magnify surface features up to 100,000,000 times, and it produces 3-D images of the surface. According to typical industry standards for SIMOX processing, the surface roughness as measured by AFM is preferably between 2–20 Angstroms RMS. Referring to FIG. 5, a graphical representation is shown of the unacceptable roughness of a miscut sample of a silicon wafer cut from a silicon ingot. The surface of the silicon wafer is sampled along at least eight nanometers (nm) as shown on the horizontal scale in FIG. 5. The roughness is measured along the vertical scale in FIG. 5, in the range of negative one hundred to one hundred Angstoms (−100.0–100.0 Angstroms). The roughness shown is outside the corresponding preferred parameters of 2–20 Angstroms RMS.

Figure 6:
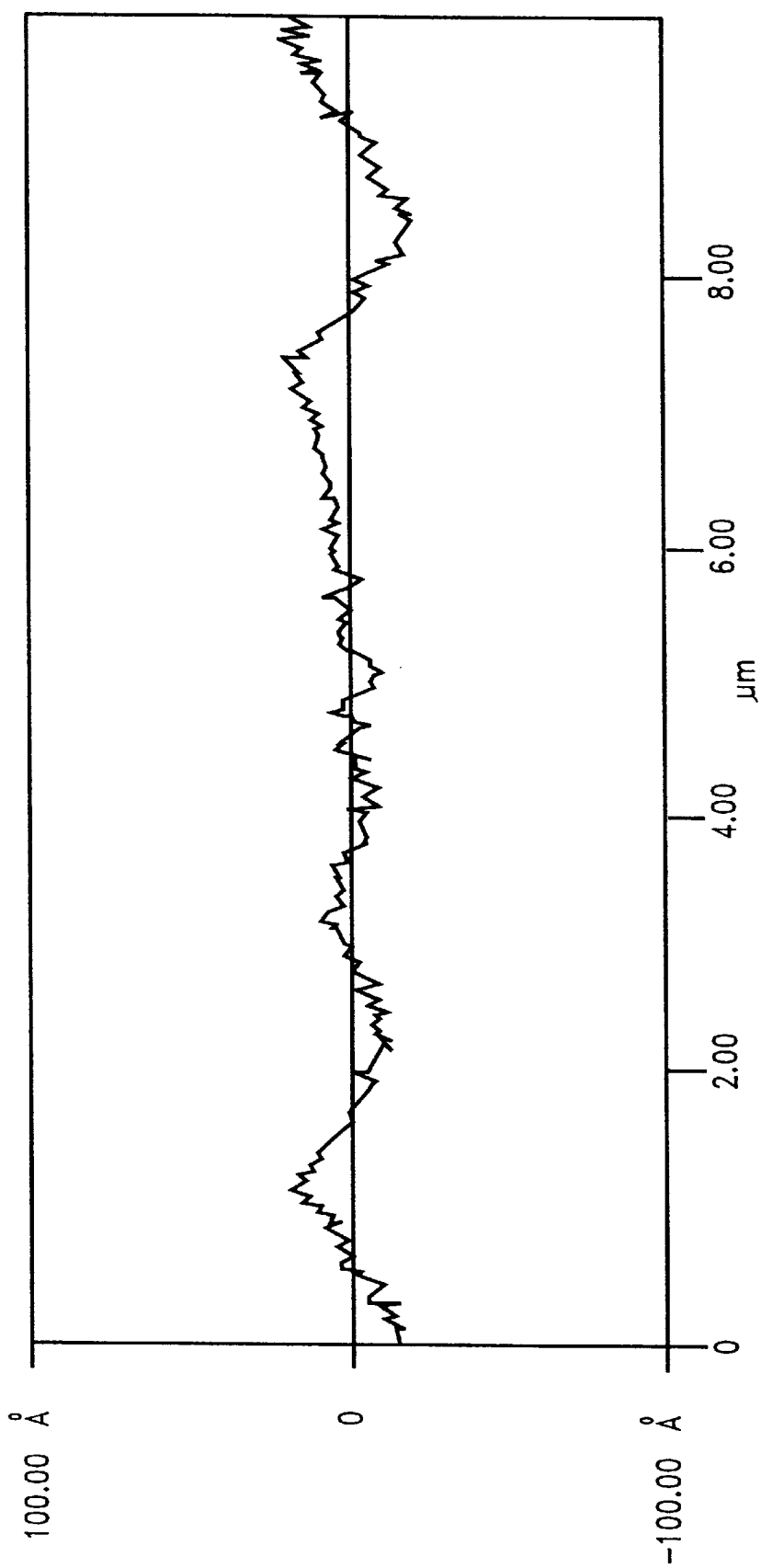
FIG. 6 is a graphical representation of an acceptable roughness of a mis-cut sample of a silicon wafer cut from a silicon ingot.

Referring to FIG. 6, an acceptable surface roughness is shown having the same vertical and horizontal scale as in FIG. 5. The roughness shown is substantially lessened as a result of the method of the present invention. The chart depicts the surface of the silicon wafer along at least eight nanometers (nm), and depicts the roughness between the negative one hundred to one hundred Angstroms of the vertical scale. The roughness shown corresponds with acceptable surface roughness preferably between 2–20 Angstroms RMS.

The present invention uses cutting along the highly symmetrical (100) crystal plane in the silicon ingot to achieve a very flat and smooth (at the atomic level) surface which can be obtained and enhanced by mirror polishing. If however, there are deviations in the cut angle from the (100) crystal plane, which is called "off orientation" cut, the morphology of the wafer surface changes as the wafer is exposed to elevated temperatures during annealing. Specifically, the wafer surface reconstructs to adapt to the misorientation by forming atomic height steps and terraces. With increasing misorientation, the width of the terraces decreases and the height of the steps increase. Reconstruction of the wafer surface depends on temperature and the miscut angle, THETA, describing the deviation from the (100) crystal plane. The presence of terraces and steps during the SIMOX process causes increased surface roughness on the finished SOI wafer. Thus, the roughness of the surface, as measured at the atomic level, along the initial cut from the silicon ingot, affects the surface of the semiconductor wafer after SIMOX processing.

Figure 2:
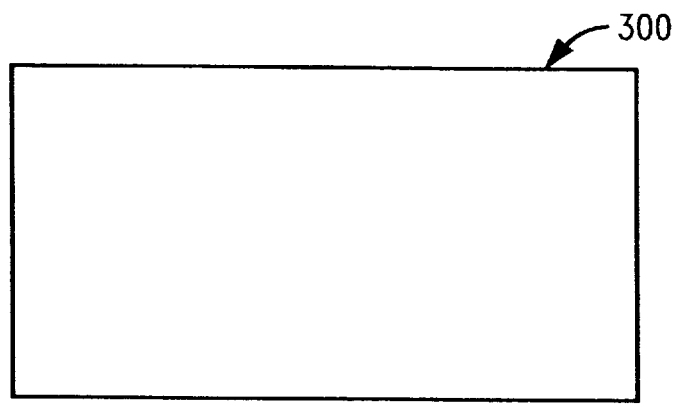
FIG. 2 is a block diagram depicting a silicon ingot used in the method of the present invention.
Figure 3:
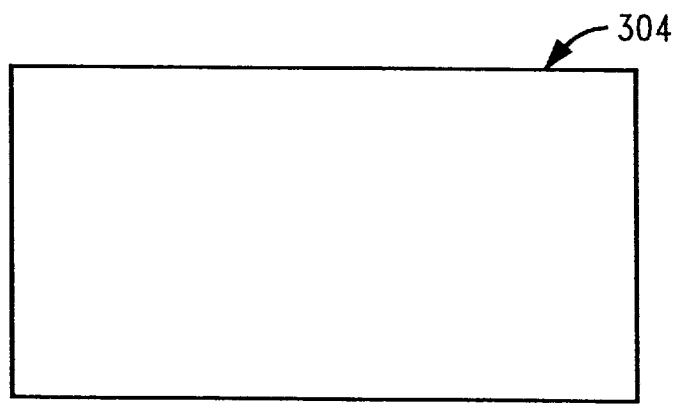
FIG. 3 is a block diagram depicting a silicon wafer cut from the silicon ingot of FIG. 2 using the method of the present invention.
Figure 4:
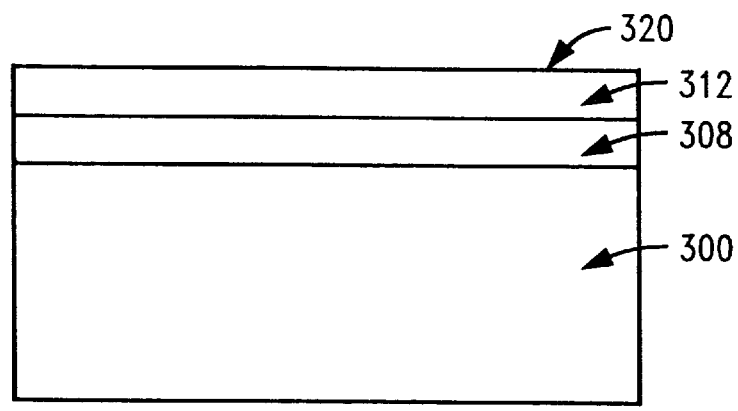
FIG. 4 is a block diagram depicting the silicon wafer of FIG. 3 after SIMOX processing.

Referring to FIGS. 2–4, the silicon substrate resulting from the method or process of the present invention, includes first providing a bulk silicon ingot 300. The silicon ingot 300 is cut using known cutting devices, preferably a wire saw, and using methodologies to provide an initial cut surface 304 on the silicon substrate or wafer 300. The cutting device is targeted to cut along the (100) crystal plane of the silicon ingot and is required to have a miscut angle of preferably between 0–0.15 degrees. The silicon substrate 300 is then processed using, preferably, SIMOX processing which includes annealing. The SIMOX silicon-on-insulator (SOI) semiconductor fabrication technique results in an oxide insulator layer 308 between a silicon top layer 312 and the silicon wafer 300. Thereby, a repeatable high quality smooth surface having desirable morphology characteristics is achieved by controlling the orientation of the starting wafer cut angle.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of improving surface morphology of a semiconductor substrate when using an SOI technique comprising:

Providing a silicon ingot positioned on a support member;

Orientating said silicon ingot on said support member;

Cutting said silicon ingot along about a (100) crystal plane of said silicon ingot to providing a silicon substrate having an initial surface, wherein cutting said silicon ingot includes a miscut angle between about 0–0.15 degrees from said (100) crystal plane; and Processing said silicon substrate using SIMOX processing which includes implanting oxygen atoms in said silicon substrate to form a buried oxide layer and annealing said silicon substrate providing a final substrate surface.

2. The method of claim 1 further including, after processing said silicon substrate, fabricating said final substrate surface using CMOS fabrication technique.

3. The method of claim 1 further comprising, after processing said silicon substrate, measuring a surface morphology of said final substrate surface using an atomic force microscopy technique; and accepting said final substrate surface for CMOS processing when said final substrate surface measures between 2–20 angstroms RMS.

4. The method of claim 1 further comprising, after processing said silicon substrate, polishing said final substrate surface using mirror polishing.

5. The method of claim 1 wherein orientating said silicon ingot includes aligning said ingot in relation to said support member and a cutting device to a predetermined position.

6. The method of claim 5 further comprising, after orientating said silicon ingot, verifying said position of said silicon ingot using x-ray diffraction.

7. The method of claim 1 wherein cutting said silicon ingot includes using a wire saw.

8. A method of improving surface morphology of a semiconductor substrate when using an SOI technique comprising:

provided a silicon ingot positioned on a support member;

orientating said silicon ingot in relation to the support member, and a cutting device;

cutting said silicon ingot along about a (100) crystal plane of said silicon ingot providing a silicon substrate having an initial surface defining a miscut angle which is less than about 0.15 degrees from said (100) crystal plane;

processing said silicon substrate using SIMOX processing which includes implanting oxygen atoms in said silicon substrate to form a buried oxide layer and annealing said silicon substrate to provide a final substrate surface; and accepting said final substrate surface for further processing when said final substrate surface measures between 2–20 Å RMS using an atomic force microscopy technique.

9. The method of claim 8 further comprising, after orientating said silicon ingot, verifying said position of said silicon ingot using x-ray diffraction.

10. The method of claim 8 further including, after accepting said final substrate surface, fabricating said final substrate surface using CMOS fabrication technique.

11. The method of claim 8 wherein cutting said silicon ingot includes using a wire saw.

12. The method of claim 8 further comprising, after accepting said final substrate surface, polishing said final substrate surface using mirror polishing.

13. The method of claim 8 wherein orientating said silicon ingot includes aligning said silicon ingot in relation to said support member and a cutting device to a predetermined position, and verifying said position of said silicon ingot using x-ray diffraction.

14. A method of improving surface morphology of a semiconductor substrate when using an SOI technique comprising:

providing a silicon substrate including an initial surface having a miscut angle from a (100) crystal plane of less than about 0.15 degrees; and processing said silicon substrate using SIMOX processing which includes:

implanting oxygen atoms in said silicon substrate to form a buried oxide layer, and annealing said silicon substrate to provide a final substrate surface.

15. The method of claim 14 wherein said final substrate surface measures between about 2–20 Å RMS using an atomic force microscopy technique.

16. The method of claim 14 further including, after processing said silicon substrate, fabricating said final substrate surface using a CMOS fabrication technique.

17. The method of claim 14 further comprising, after processing said silicon substrate, polishing said final substrate surface using mirror polishing.

18. The method of claim 14 further comprising, after processing said silicon substrate, measuring a surface morphology of said final substrate surface using an atomic force microscopy technique; and accepting said final substrate surface for CMOS processing when said final substrate surface measures between 2–20 angstroms RMS.

19. The method of claim 18 further comprising, after accepting said final substrate surface, polishing said final substrate surface using mirror polishing.

* * * * *